(12) United States Patent
Goker et al.

(10) Patent No.: US 9,431,054 B1
(45) Date of Patent: Aug. 30, 2016

(54) DOUBLY DISTRIBUTED ERASURE CODES

(71) Applicant: Quantum Corporation, San Jose, CA (US)

(72) Inventors: Turguy Goker, Vista, CA (US); Suayb S. Arslan, Irvine, CA (US); Don Doerner, San Jose, CA (US); Hoa Le, Orange, CA (US)

(73) Assignee: Quantum Corporation, San Jose, CA (US)

( * ) Notice: Subject to any disclaimer, the term of this patent is extended or adjusted under 35 U.S.C. 154(b) by 0 days.

(21) Appl. No.: 14/727,893

(22) Filed: Jun. 2, 2015

(51) Int. Cl.
| | |
|---|---|
| *G11B 5/09* | (2006.01) |
| *G11B 20/18* | (2006.01) |
| *G11B 5/008* | (2006.01) |
| *G06F 11/10* | (2006.01) |
| *H03M 13/15* | (2006.01) |
| *H03M 13/27* | (2006.01) |
| *H04L 1/00* | (2006.01) |
| *H03M 13/11* | (2006.01) |
| *G11B 20/14* | (2006.01) |

(52) U.S. Cl.
CPC ....... *G11B 20/1833* (2013.01); *G06F 11/1076* (2013.01); *G11B 5/00817* (2013.01); *H03M 13/154* (2013.01); *H03M 13/2792* (2013.01); *G11B 20/1426* (2013.01); *H03M 13/116* (2013.01); *H04L 1/0057* (2013.01)

(58) Field of Classification Search
None
See application file for complete search history.

(56) References Cited

U.S. PATENT DOCUMENTS

| | | | | |
|---|---|---|---|---|
| 6,311,305 B1 * | 10/2001 | Sollish | ............. | G11B 20/00086 341/106 |
| 8,601,339 B1 * | 12/2013 | Cypher | ............. | H03M 13/2909 714/752 |
| 8,615,698 B1 * | 12/2013 | Cypher | ............. | H03M 13/2918 714/758 |
| 8,621,289 B2 * | 12/2013 | Gunnam | ............ | H03M 13/1137 714/701 |
| 8,640,000 B1 * | 1/2014 | Cypher | ............. | H03M 13/2909 714/752 |
| 2011/0307758 A1 * | 12/2011 | Fillingim | ............ | G06F 11/1048 714/758 |
| 2011/0314354 A1 * | 12/2011 | Fillingim | ............ | G06F 11/1048 714/760 |
| 2015/0303947 A1 * | 10/2015 | Li | ...................... | H03M 13/1105 360/40 |

* cited by examiner

*Primary Examiner* — Tan X Dinh

(74) *Attorney, Agent, or Firm* — Eschweiler & Associates, LLC

(57) ABSTRACT

Methods, apparatus, and other embodiments associated with doubly distributing erasure encoded data in a data storage system are described. One example apparatus includes a set of data storage devices and a set of logics that includes an encoding logic that generates an erasure encoded object that includes code-words, and chunks the code-words into code-word chunks, and a distribution logic that interleaves members of the set of code-word chunks into a plurality of records, and distributes the records across the data storage devices and within individual data storage devices. Example apparatus may include a read logic that reads the plurality of stored records from the data storage devices, and ignores read errors, and a repair logic that monitors the set of data storage devices, replaces or repairs failing data storage devices, generates replacement records, and stores the replacement records on a replacement data storage device.

20 Claims, 13 Drawing Sheets

DOUBLY DISTRIBUTED ERASURE CODES

BACKGROUND

Stored data may be protected against storage media failures or other loss by storing extra copies, by storing additional redundant information, or in other ways. One type of redundancy based protection involves using erasure coding. Erasure coding uses additional redundant data to produce erasure codes (EC) that protect against 'erasures'. An erasure may be an error with a location that is known a priori. The erasure codes allow data portions that are lost to be reconstructed from the surviving data. The application of erasure codes to data storage may typically have been for the purpose of recovering data in the face of failures of hardware elements storing the data. Tape cartridges using Dual Reed Solomon erasure coding can achieve a bit error rate (BER) significantly lower than hard disk drives (HDD). For example, using random error distribution, linear tape open (LTO) 6 tapes may achieve a BER of 1 in $10^{17}$ or even 1 in $10^{19}$ bits.

However, like HDDs, tapes exhibit non-Gaussian error modes that dominate the mean time between failures (MTBF). Tape drives often encounter errors during reading, including off track errors, media data errors, damaged tape, deteriorated tape, host drive speed mismatches, and other hardware and firmware problems. Conventional tape drives retry a read when an error is encountered. Retries result in repetitive repositioning, which combined with the high speeds of tape drives, leads to further deterioration and damage to the tape. The damage may include tape surface damage and air entrainment problems, which in turn lead to even more errors. Conventional tape formats do not have useful approaches to deal with hard read errors, other than retries with repositioning. Thus, if the data in the damaged section of tape cannot be read, conventional tape systems give up, even though the rest of the data on the tape is fine. Conventional systems therefore rely on tape backup copies to recover original data at the cost of overhead. However, the backup copies are also subject to the same errors, which may result in multiple unusable tape cartridges within a data storage system.

Erasure codes are often used to increase data storage durability, but come with the cost of overhead. However, the conventional deployment of erasure codes does not protect data from localized damage to tapes that is beyond the power of the systems internal to the tape system to correct. Conventional tape systems thus make multiple copies of cartridges, also known as replication, to achieve required levels of durability. For example, to achieve enterprise levels of durability, a conventional tape data storage system, even assuming errors were random, would require multiple copies of data. However, critical tape errors are not uniformly random.

LTO's internal error correction coding (ECC) system as used in conventional systems cannot efficiently deal with many types of hard errors, including lost cartridges, cut tapes, lost pins, environment issues, loss of magnetic coating, shock and vibration, edge damage, debris and particles, magnetic coating wear, and staggered wraps. For example, if a conventional system loses a cartridge because a robot dropped the cartridge or someone stole it, the data is gone, regardless of the BER or the ECC system employed. To handle these kinds of hard errors and achieve eleven nines or more of durability, conventional systems need at least six copies, potentially residing at different sites, which is costly and provides a significant tape management challenge. For example, if a file is distributed over 4 tapes to increase transfer rates but still needs to be replicated 6 times to achieve the desired durability, the system would need 24 tapes, which is not an optimal solution. Availability issues for a tape cartridge may occur at the tape level (e.g., lost tape, damaged tape) or at a system level (e.g., tape library robot down, unavailable).

BRIEF DESCRIPTION OF THE DRAWINGS

The accompanying drawings, which are incorporated in and constitute a part of the specification, illustrate various example apparatus, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
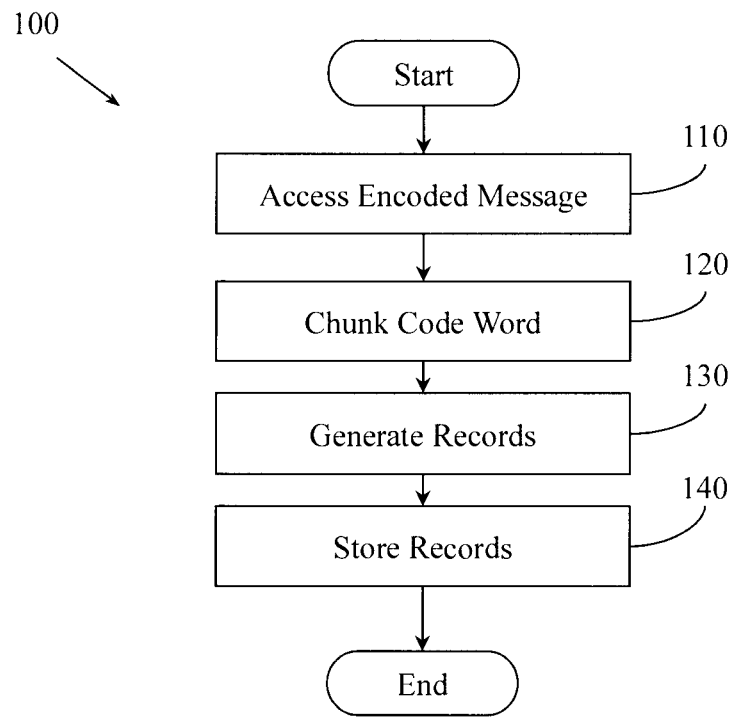
FIG. 1 illustrates an example method for storing data in a data storage system.

Example methods and apparatus improve on conventional data storage approaches by using fountain erasure coding to encode data and to distribute the data across multiple tape cartridges. A fountain code is a rateless erasure code. Within individual tape cartridges, the data is spread down the length of tape in interleaved records. Thus, the erasure codes are doubly distributed. Example methods and apparatus control tape drives to read from cartridges that store rateless erasure encoded data exhibiting errors without resorting to tape and drive damaging retry algorithms that conventional approaches use to recover data from damaged or worn-out regions of storage media. Example methods and apparatus distribute subsets of erasure codes to a plurality of different data storage devices, including tapes, which mitigates the impact of unavailable tape robots, lost tapes, or damaged tape errors. Example methods and apparatus also write specific subsets of erasure codes to individual tapes in an interleaved fashion, which mitigates the impact of smaller, tape level errors that can be handled by a tape's internal ECC. Thus, the erasure codes are doubly distributed, which facilitates handling errors in unexpected ways (e.g., ignoring read errors, ignoring buffer overflows). Example methods and apparatus read from the plurality of data storage devices and re-assemble the stored data while ignoring small tape errors, full tape drive caches, and host read buffer overflows. Example methods and apparatus thus improve on conventional data storage approaches by providing at least eleven nines of durability.

Conventional data storage systems may employ arrays of hard disk drives (HDD). For example, an enterprise level HDD with 1,200,000 hours mean time between failures (MTBF) provides 99.27% durability, or 2.13 nines of durability. In an enterprise situation, 2.13 nines of durability may be unacceptable. Therefore, conventional data storage systems may employ RAID5 or RAID6 type protection to increase durability, and may also employ ECC on the arrays of HDDs. In conventional systems, RAID6 using six HDDs may offer five nines of durability. However, HDD is more expensive than tape, and has a higher BER than LTO6 tape. For example, a typical HDD in a RAID6 array has a BER of 1 error in $10^{14}$ bits, while an LTO6 tape in a replication-based system has a BER of 1 error in $10^{19}$ bits. Thus, tape cartridges offer higher BER reliability over HDD. However, an LTO6 drive as a stand-alone system only offers 1.7 nines of durability compared to the HDD that offers 2.13 nines. Even though tape has much better BER it also lacks MTBF or average failure rate robustness which may result in lower durability in a stand-alone solution.

To achieve five nines of durability with the conventional LTO6 system three copies would be needed. Some of the reliability projections for LTO6 tape assume that tape errors are random, independent and have a Gaussian distribution. However, the statistical nature of tape errors is neither uniformly random nor Gaussian. Conventional LTO6 systems may employ internal ECC algorithms to protect data. Data is conventionally stored on LTO6 tape using data sets. A data set is an internal ECC protected packet of data written on a data storage medium, including tape. Conventional LTO6 tape uses a data set size of approximately 2.5 MB. At typical LTO linear densities, this means a data set uses about 105 mm of tape. If a data set payload is protected with two layers of ECC using heavy interleaving down the length of the tape and across 16 channels, written data can be totally recovered even though all the read heads fail to read, as long as the error event is less than 8 mm in length. However, if a tape drive encounters error incidents, including damaged tape, worn magnetic sections, or debris longer than 8 mm, the drive will fail, declaring a media error after going through an exhaustive retry effort. Exhaustive retries are not healthy because repetitive repositions over the same area can result in further damage, which may render the tape unreadable. Thus, while conventional approaches using layered ECC with interleaving on LTO6 tape offer some benefits compared to HDD, they are not optimal, and depend on an assumption that tape errors will be random and independent.

Tapes are prone to failures because of non-random errors. These non-random errors are correlated and strongly influenced by mechanical and environmental disturbances. Non-random, correlated errors that are strongly influenced by mechanical and environmental disturbances include lost cartridges, cartridges that are unavailable because a robotic library is broken, busy, or otherwise unavailable, cut tapes, lost pins, environment issues, loss of magnetic coating, shock and vibration, edge damage, debris and particles, magnetic coating wear, and staggered wraps. In a conventional system, losing the tape results in losing the data, even if the BER of the tape format is one error in five million tapes. In another situation, a well-written tape might incur edge damage over 10 mm in length which results in total loss of the data, even though the entire tape might be half a mile long and only 12 mm are damaged. Conventional systems are unable to handle these kinds of errors without excessive complexity and cost.

For example, to provide eleven nines of durability, conventionally deployed LTO6 tape systems that rely on replication for durability require at least six copies of data. This results in costly tape management challenges to ensure that all the copies are reliable and healthy. There is also the potential that wrong data might be generated and propagated into all the copies. Furthermore, managing all the copies extends restore times. Additionally, some rare, but still probable error events that are caused by drive-tape interaction at beginning of tape (BOT) or end of tape (EOT) zones can cause all the copies to fail. In some cases, no problem found (NPF) errors can aggregate errors, resulting in even longer restore times due to having to locate more copies when the original fails.

Furthermore, conventional replication-based systems do not increase data transfer rates unless they are combined with distribution over multiple tapes. For instance, in a conventional system a file may be distributed over four tapes to increase data transfer rates. However, the distribution does not remove the requirement to duplicate the tape six times, resulting in 24 tapes. In many situations, needing 24 tapes to reliably store data that fits on one tape is unacceptable. Furthermore, in order to realize the full potential of I/O parallelism, 24 tape drives might be costly to mount or allocate for a single data retrieval operation in a data center.

Example methods and apparatus improve on conventional methods by handling the types of errors conventional methods cannot handle without impractical and expensive overhead. Example methods and apparatus adapt to data storage system conditions, monitor the health of the data storage system, and doubly distribute erasure codes in individual storage devices and across multiple storage devices. Example methods and apparatus may achieve speeds eight times faster than conventional replication-based tape systems with eleven nines of durability while using only 1.8× overhead compared to 48× overhead. Example methods and apparatus employ multi-layer erasure coding with a data interleaving approach based on a tape's logical format and apply erasure coding to LTO tape at a level where the remaining errors may be random, which enables a tape drive's internal ECC engine to efficiently correct the remaining errors. Example methods and apparatus are thus able to achieve one error in five million cartridges even in real world conditions, while using only an additional 80% overhead to achieve eleven nines of durability.

Some embodiments of example methods and apparatus use Raptor type erasure codes for encoding and decoding data. Raptor codes are from the family of Fountain codes. Other embodiments may use Reed Solomon codes or other Fountain codes. In one embodiment, files, based on the file size, may be represented by single or multiple code-words, when the file size is within the minimum or maximum of a size range. Files greater than the maximum size are broken into multiple objects, where an object is a single code-word. Files smaller than the minimum size may be packaged with other files, or padded, so they may be encoded as objects within the size range. Fountain codes, of which Raptor codes are a type, provide an advantage over other types of ECC when used with a min-max file size range, making example methods and apparatus easier to manage than conventional systems, and improving the ease with which files may be distributed over multiple tapes more reliably.

For example, a conventional system using industry-standard Reed Solomon encoding of a 100 MB file would require code-words with a small symbol size, such as 20 symbols per code-word, where each symbol is limited to 8 bits. Thus, for a 15/5 policy, for each 10 bytes of data the conventional system would carry 5 bytes of parity, and the 100 MB file would be represented by 10 million code-words, where each code-word has 10 bytes of data and 5 bytes of parity. However, by using rateless codes, including Raptor codes, example methods and apparatus can represent the entire 100 MB file by a single code-word, such that with the same 15/5 policy the code-word would have only 15,000 symbols where an individual symbol is 10K bytes. Example methods and apparatus thus may encode a file within the min-max size range with a single code-word. A code-word may have varying numbers of symbols, and the symbols may have a fixed size. In this example, the number of parity symbols for a code-word using Reed Solomon codes is 5 parity symbols per code-word, while Raptor codes would use 5000 parity symbols for a single code-word with the same 15/5 policy.

Example methods and apparatus may optimize the min-max range based on the logical format of the tape used, error types, and the implementation of particular rateless codes to achieve acceptable execution times for different processors and different buffer sizes. For example, the LTO tape format is based on data sets where a data set is protected by an internal two layer Reed Solomon ECC. When a drive fails to read data due to a large enough error that cannot be corrected by the tape's internal ECC system, conventional systems report a read error and stop the tape motion. For LTO6, a data set is 2472960 bytes, and a single read error in a conventional system would result in the loss of all 2.5 TB of data even though the read error occurred in just a single data set of 2472960 bytes. Example methods and apparatus optimize the selection of the min-max range based on the number of tapes across which the encoded data will be spread, and on the size of the data set based on the LTO format in use. By spreading erasure code-words over many data sets, a read error due to a single data set will not cause a failure in example methods and apparatus.

Some embodiments of example methods and apparatus employ a 16/4 policy for an LTO6 tape system with a monthly to 1.5 monthly repair period, resulting in 12.8 nines of durability. A 16/4 policy allows using numbers of drives equal to powers of two, and similar cartridge counts, which results in easier tape library management. Example methods and apparatus employing Raptor based ECC may employ a symbol size of 65536 bytes (64 KB). Symbol sizes in this range increase efficiency compared to conventional methods that may use smaller symbol sizes, because example methods and apparatus may attach an identifier or metadata to symbols stored in a plurality of tapes to more efficiently identify which symbols belong to which encoded files or encoded objects. Smaller symbol sizes result in more symbols, more metadata to track, and less efficient systems. The larger size symbols used by example methods and apparatus result in the manipulation of relatively fewer symbols or metadata when representing or handling files or objects.

Example methods and apparatus may optimize the min-max size range for assigning symbols based on file size, tape format, or a policy.

Some portions of example methods and apparatus select a set of encoded files so that selecting one symbol from the different encoded files in the set of encoded files establishes a data set, which results in a single symbol loss when a tape drive issues a media error due to a data set read failure. By establishing data sets this way, example methods and apparatus spread the erasure encoded data over multiple tape cartridges based on the LTO logical format characteristics of the tape drives. This mitigates the damage from losing a data set, compared to conventional approaches. Example apparatus and methods use identification tags that identify individual symbols. Using fountain codes with larger symbol sizes instead of Reed Solomon codes with smaller symbol sizes makes example methods and apparatus more efficient and easier to manage than conventional approaches because the larger symbols result in fewer identification tags and associated metadata compared to conventional systems. Moreover, using fewer code-words reduces the effect of interleaving overhead and makes the system more robust against failures. When files are chunked for encoding or for generating segments for storage, smaller code-words make a system more vulnerable to random failures. By encoding a file as larger code-words, or as a single code-word, the impact of random failures is reduced. To achieve similar levels of protection, systems using smaller code-words must compensate by adding additional redundancy, or interleaving overhead.

In one embodiment, code-words are interleaved and distributed across 16 tapes to establish optimum reliability based on the LTO logical format unit, the data set. A given erasure code policy will determine how much tape to use and what symbol size in bytes to use when interleaving symbols. In LTO6, a data set is 0.1 meters long. Thus, X meters of LTO6 tape used for interleaving results in a total of N=X/0.1 data sets. When each symbol is T bytes long, where T is an integer greater than 0, the resulting number M of symbols per data set is 2.474M bytes/T bytes. Thus, in one embodiment, there will be N data sets for each cartridge in a set of 16 cartridges to store, N being an integer.

In this example, objects are chunked into M sub-data sets. A sub data set includes N symbols, where a symbol is T bytes. Thus, the object size is M*N*T bytes. A sub-data set is encoded using an erasure code, resulting in M code-words. Based on the protection policy being used, a code-word includes K symbols with T bytes per symbol. The policy may include N data symbols plus K-N protection parity symbols.

When a sub-data set is encoded individually, a code-word with K symbols will be unique. In this example, code-words are chunked into 16 unique code-word chunks. A code-word chunk has D symbols, where D=K/16 in this 16 tape cartridge example. In one embodiment, a code-word chunk from each of the 16 code-words is used to form a code-word chunk pool, or record, which may be distributed to a given tape cartridge. In another embodiment, fewer than each of the 16 code-words may be used. Using the code-word chunk pool, example methods and apparatus form records that are written to tape so that a record includes one symbol from the different individual code-word chunks in the pool. With M code-word chunks in a pool, where a chunk has D symbols, records thus have M symbols of T bytes per symbol. This results in a data set size that is equal to, or approximately equal to, the size for a data set on an LTO6 tape, which is 2,472,960 bytes.

Example methods and apparatus may use a cartridge count, symbol size, protection policy, and tape length as inputs. Object size, code-word size, and code-word symbol count may be the resulting outputs. Example methods and apparatus select a protection concept using a policy and the number of cartridges and control the spread of the encoded symbols over a length of tape. Doubly distributing erasure codes by spreading the data over a number of cartridges and by spreading the data along the length of the tape per cartridge provides double protection against the types of errors that conventional approaches cannot handle. Since data sets are the smallest data units protected by the internal ECC system built into tape drives and tapes, and since a logical tape format may have a fixed length of tape, example methods and apparatus protect encoded data by controlling how the encoded symbols per code-word are distributed over the data sets. For instance, if a code-word was chunked into 16 code-word chunks and each chunk was stored to individual tapes, a data set subject to a media error would result in the loss of all the symbols belonging to the same code-word, thus weakening the protection offered by the overall EC policy. However, example methods and apparatus further distribute interleaved symbols from the different code-words over a length of tape, and control how many symbols are written to a given data set. This improves on conventional approaches by strengthening the entire policy of the data storage system, where many data set read errors still result in a smaller number of symbols lost, based on the distribution policy.

Example methods and apparatus further improve on conventional storage approaches by reducing the number of repetitions that occur in tape drives due to errors or host transfer rate mismatches. For example, conventional approaches will attempt many potentially damaging retries when they encounter a media error among a collection of tape drives. Example methods and apparatus provide the option of continuing to read with the errors, or moving on by skipping over the damaged region that produced the error without replacing the tape. The ramp up distance consumed by the drive will not result in a fatal loss of symbols because interleaved symbols from the code-words are spread over a length of tape.

Some embodiments may employ the following variables and definitions when reading and writing data:

N=the number of data symbols in original data to be stored

K=the number of encoded symbols in a code-word r=the rate of the erasure code used C=the number of tape cartridges used to store encoded data L=the length of tape in meters used to spread encoded data over d=the number of data sets used in L meters of tape T=symbol size in bytes k=the number of symbols per data set, where LTO6 data set size is 2472960 bytes M=the number of code-words in an object with K symbols T, L, and R may be given m=the number of symbols from a code-word that are in the same data set P=object payload p=code-word payload R=record for tape b=the number of data sets in a record Example methods and apparatus may perform the following calculations to compute values for the above listed variables when reading and writing encoded data:

d=L/0.1, where the data set length for LTO6 tape is 0.1 meters, k=2472960/T. The k symbols may originate from individual code-words based on the number of symbols m from a code-word that are in the same data set.

To spread m symbols from the same code-word per data set over d data sets, a total of M=k/m code-words are employed. A code-word will have C chunks where a chunk is m*d symbols, and K symbols per code-word, where K=C·m·d symbols. The payload p of a code-word is defined as p=KT. An object is made from M code-words, so the payload of an object is P=MKT(N/K) bytes.

In one embodiment, 16 tape cartridges are deployed in a system with a 0.75 policy rate, which is a 16/4 policy. In this embodiment, a tape length of 1 meter is used per tape, with 1024 bytes per symbol, and 10 symbols from the same code-word per data set. Data is formed into a 297 MB object. After encoding using a 16/4 policy, the encoded object of 396 MB is broken into 242 encoded code-words of 1600 symbols, where a symbol has 1024 bytes. Based on the policy, a code-word losing more than 400 parities results in data loss. For example, if 4 cartridges are lost, 400 parities would be lost and the very next error would cause data failure. Four cartridges may all be "lost" simultaneously when, for example, an entire robotic tape library is unavailable. Thus, the limit for lost or catastrophically damaged cartridges in this example is 4. Example methods and apparatus may be optimized for different conditions and different error types or sizes of tape damage. For example, an error length of 100 mm within 1 m of tape length would result in 10 errors. This embodiment can accommodate up to 40 100 mm errors scattered across 16 tapes over 1 m sections in each tape to reach the limit of the error correction capability. This embodiment provides this protection with a 33% overhead (16/4 policy). Example methods and apparatus therefore provide a tangible improvement over conventional approaches.

Systems employing example methods and apparatus may employ a buffer or a cache to manage data being written and read so that tape drives or other devices may be streamed at high optimum speeds, and so that a drive's internal data processing may minimize repositions. For example, when there is a mismatch between how fast a host can accept data from a cache, and how fast a tape drive can provide the data to the cache, conventional systems control tape drives to perform multiple repositions to read and reread the data so the slower host can catch up. Example methods and apparatus avoid performing multiple repositions while waiting for the host to clear the buffer because records that may be lost due to the full buffer can be treated as tape errors and ignored.

When writing, example methods and apparatus collect files to form an object. The object is chunked into M chunks based, at least in part, on the inputs tape length, symbol size, and policy. Chunks are encoded to form M code-words, where a code-word has K symbols. Code-words are chunked into C code-word chunks, where C is the number of cartridges across which the data is to be stored. Symbols from code-word chunks from different code-words are interleaved with each other to form a record. Records are written to tape. Symbols from different data sets and tapes are linked to code-words so that the data may be decoded. Symbols are linked to code-words and code-words are linked to objects, enabling the original set of files to be reconstructed.

Example methods and apparatus may employ a linear tape file system (LTFS) and metadata to link symbols, data sets, code-words, records, objects, or files.

Example methods and apparatus further improve on conventional tape data storage approaches by providing robust repair and maintenance capabilities. Tapes may become lost, may be physically damaged in ways that conventional systems cannot accommodate, or may be unavailable due to issues with a robotic library. Example methods and apparatus, while providing improved durability over conventional systems, may still want to repair or replace tape cartridges that have, or are demonstrating characteristics of, catastrophic failure that would weaken the durability of the system. For example, example methods and apparatus may provide a 16/4 policy, and can recover data even with 4 tapes lost or failed. However, after those 4 tapes are lost, example methods and apparatus would offer a weakened level of protection. Losing two tapes would also reduce the protective effectiveness of the remaining tapes, unless the lost or failing tapes are repaired or replaced in a timely manner. Thus, example methods and apparatus may repair or replace failing tapes before protection degrades. Repair does not have to wait for failed tapes. Repair can be preventative. Example methods and apparatus monitor the performance of cartridges, or other data storage devices, and decide to rebuild, repair, or replace weak cartridges, or cartridges that are exhibiting signs of imminent failure before they actually fail. Example methods and apparatus thus leverage the non-random, non-Gaussian hard failures that conventional approaches are unable to handle to further improve performance and efficiency.

To repair or replace failing tape cartridges, example methods and apparatus may follow a series of steps. In one example, 16 tape cartridges are used with a 16/4 policy. The repair process thus needs a minimum of 12 tape cartridges to decode data for repair. The first step is to use the remaining cartridges, which may be undamaged, or less damaged than the ones undergoing repair to decode the stored data to the original data. In other examples, other numbers of tapes may be used with different policies that require a different minimum number of tapes.

Figure 12:
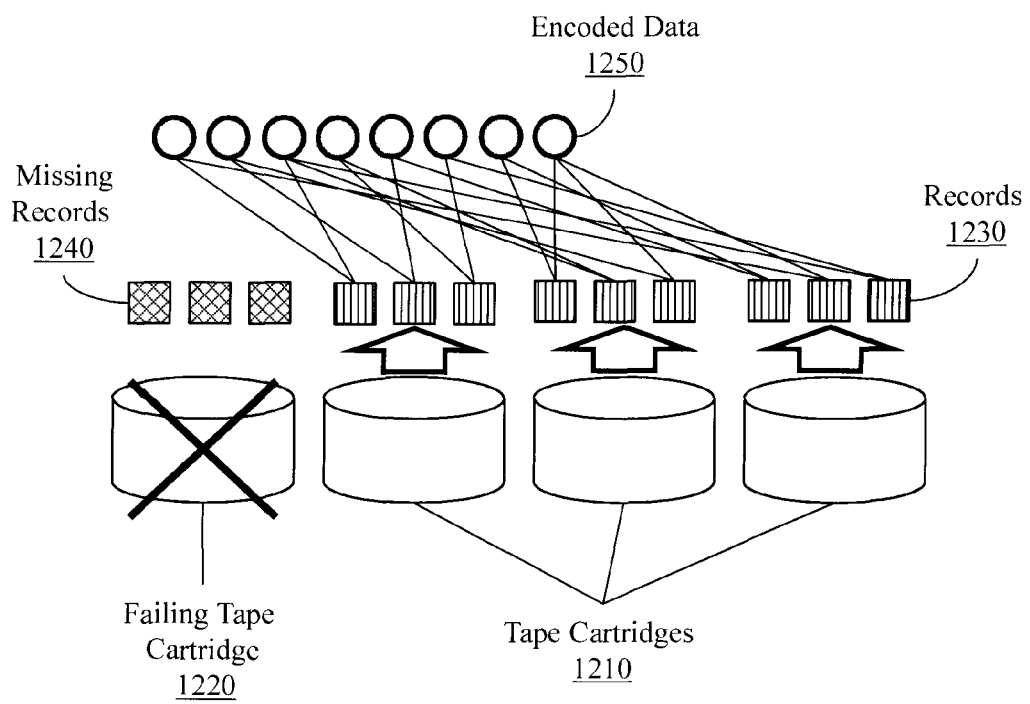
FIG. 12 is a block diagram that illustrates recovering data from a tape data storage system.
Figure 13:
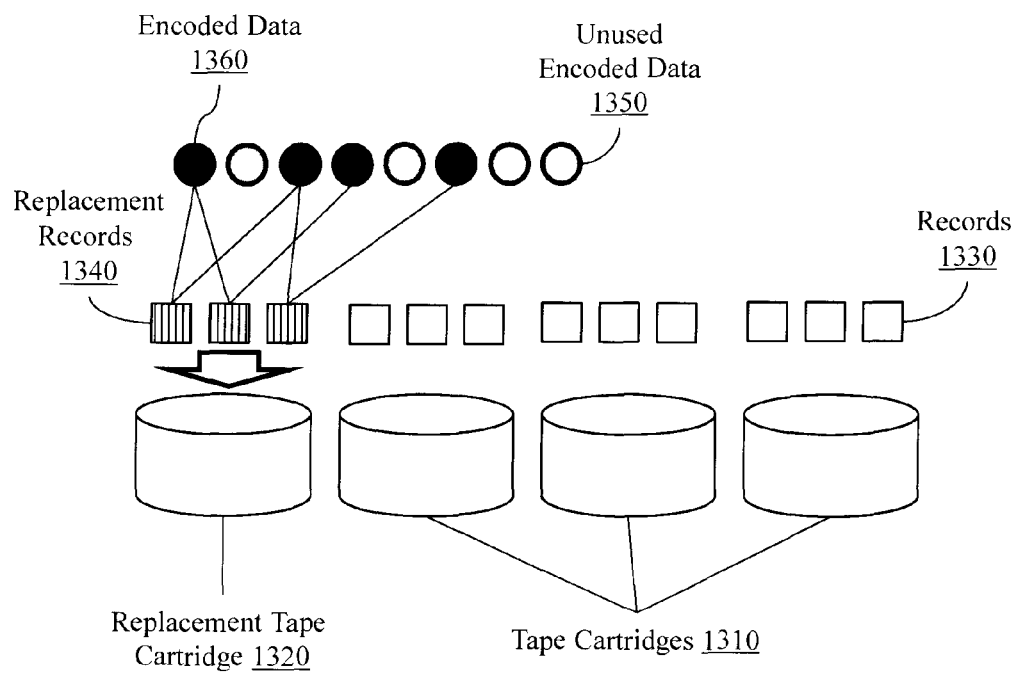
FIG. 13 is a block diagram that illustrates replacing encoded data to a replacement tape cartridge.

The second step includes encoding the data from the data decoded in the first step. In some embodiments using Reed Solomon codes, all the data is encoded from the decoded data to perform a full repair. In another embodiment using Raptor codes or other rateless codes, only some of the data needs to be decoded to perform a partial repair. For example, using Raptor codes, only the missing symbols need to be encoded, and not the entire set of symbols. A partial repair reduces the time spent performing the repair process, further increasing the durability provided by example methods and apparatus. The third step of the repair process includes storing the missing symbols to a new cartridge. FIGS. 12 and 13 illustrate one embodiment of the repair process.

Example methods and apparatus may be applied to systems using just one tape cartridge, HDD, or other storage device. In a single tape example, longer tape lengths over which data may be distributed may be employed to increase robustness against tape errors through increased symbol counts. In one example, a policy rate r of 0.75 is used. One cartridge C is used. The number of bytes T per symbol is 1024, and the tape length is 10 meters. The number of symbols m, per data set is 10. This input results in a number d of 100 data sets per object, with a number k of 2415 symbols per data set. The number of symbols K per code-word is 1000, and there are 250 parity symbols. The number of code-words is 242 where each code-word has 1000 symbols. The code-word payload p in megabytes is 1.02, and the object payload P in megabytes is 185.86. Therefore with 33% overhead this embodiment can correct for any data loss or data unavailability that is less than 10 m long. In other embodiments, other inputs may produce different results.

Example methods and apparatus may also mitigate inefficiencies caused by drive-host speed mismatch situations. For example, if a host is processing data out of a buffer slower than a set of tape drives are providing the data to the buffer, tape drives in a conventional system will end up performing repetitive repositions to reread data because the slower host's buffer will fill up faster than the host can empty it. Similarly, a drive's buffer or cache size and speed selection algorithms will also affect a host's speed, further increasing the chance that the tape drives will have to reposition and reread to wait for the host to buffer to clear. Example methods and apparatus reduce the number of repositions required by spreading encoded, interleaved objects over a length of tape. In the single tape situation described above, example methods and apparatus could let tape drives continue to move for at least 1.5 seconds at LTO6 transfer rates while a host handles a full cache before needing to reposition. In this situation, allowing the tape drives providing data to a full host buffer to continue running for a period of time is made analogous to a situation where the tape drives have a read error. As long as the host clears the buffer before a threshold amount of tape has moved, the tapes can keep running without potentially damaging repositions.

The detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

FIG. 1 illustrates a computerized method 100 for storing data in a data storage system. Method 100 includes, at 110, accessing an encoded message that includes a plurality of code-words. In one embodiment, the encoded message is encoded with an erasure code. The erasure code may be a Raptor code, a Fountain code, or a Reed Solomon code. In other embodiments, other generic linear or rateless codes may be used to generate the plurality of code-words.

Method 100 also includes, at 120, chunking a code-word from the plurality of code-words into C code-word chunks, where C is an integer greater than zero. In one embodiment, C is a function of the number of tape cartridges in a plurality of tape cartridges on which the encoded message will be stored. In another embodiment, C is a function of other data storage system parameters.

Method 100 also includes, at 130, generating a plurality of records. In one embodiment, method 100 interleaves into a record a first code-word chunk from a first member of the plurality code-words with a second, different code-word chunk from a second, different member of the plurality of code-words. In one embodiment, a code-word chunk from the first code-word is positioned a threshold physical or logical distance apart from other code-word chunks from the first code-word. In one embodiment, the code-word chunk from the first code-word is positioned so that it is not adjacent to another code-word chunk from the first code-word. In one embodiment, the code-word chunk from the first code-word is positioned so that it is at least 1 mm, at least 10 mm, or at least 100 mm from another code-word chunk from the first code-word. Different distances may be employed. This distributes erasure codes in a first way on a single tape or single device. In this embodiment, a record includes record metadata about the code-word chunks interleaved into the record. By keeping code-word chunks from one code-word physically distanced from other code-word chunks from the same code-word, method 100 protects against data loss from physical damage that would make an individual data set unreadable in a conventional system.

In one embodiment, the record metadata includes an end file marker, an object ID, an access point, an object size, a chunk size, a number of symbols, a symbol size, a block ID, or a number of encoded chunks. In this example, the end of file marker is appended to the end of a file to indicate the end of that file. The object ID contains a unique identifier for the object. The access point indicates an access point for the beginning of the first file in the object. The chunk ID contains a unique identifier for a chunk. The chunk size indicates the size of the chunk and may be included in headers and source data. The number of symbols indicates the total number of symbols. The symbol size indicates the size of a symbol. The block ID contains a unique identifier for a block, and the number of encoded chunks indicates the total number of encoded chunks in the block. In another embodiment, other metadata may be included in the record metadata. In one embodiment, the record metadata associates symbols from a tape cartridge or other data storage device with code-words and objects such that when the data storage system reads symbols from different data storage devices, it can associate the symbols with the appropriate code-words, files, or objects to recover the original data.

Method 100 also includes, at 140, storing the plurality of records on the plurality of tape cartridges. This distributes the erasure codes in a second way, between a number of tapes or devices. In one embodiment, storing the plurality of records includes storing a first record on a first tape cartridge and storing a second, different record on a second, different tape cartridge. In this embodiment, storing a record on a selected tape cartridge includes storing code-word chunks from the same code-word at least a threshold physical distance apart on the selected tape cartridge. The threshold physical distance may be based, at least in part, on the logical format of the tape, the amount of data to be stored, a protection policy, a level of interleaving, a number of code-words, a symbol size, a data set size, a desired number of nines of durability, environmental conditions, tape length, the number of tape cartridges in the plurality of tape cartridges, or other parameters. The threshold physical distance may be adaptable. In one embodiment, the threshold physical distance is at least 10 mm of tape.

While FIG. 1 illustrates various actions occurring in serial, it is to be appreciated that various actions illustrated in FIG. 1 could occur substantially in parallel. By way of illustration, a first process could access an encoded message, a second process could chunk a code-word, and a third process could generate records. While three processes are described, it is to be appreciated that a greater or lesser number of processes could be employed and that lightweight processes, regular processes, threads, and other approaches could be employed.

Figure 2:
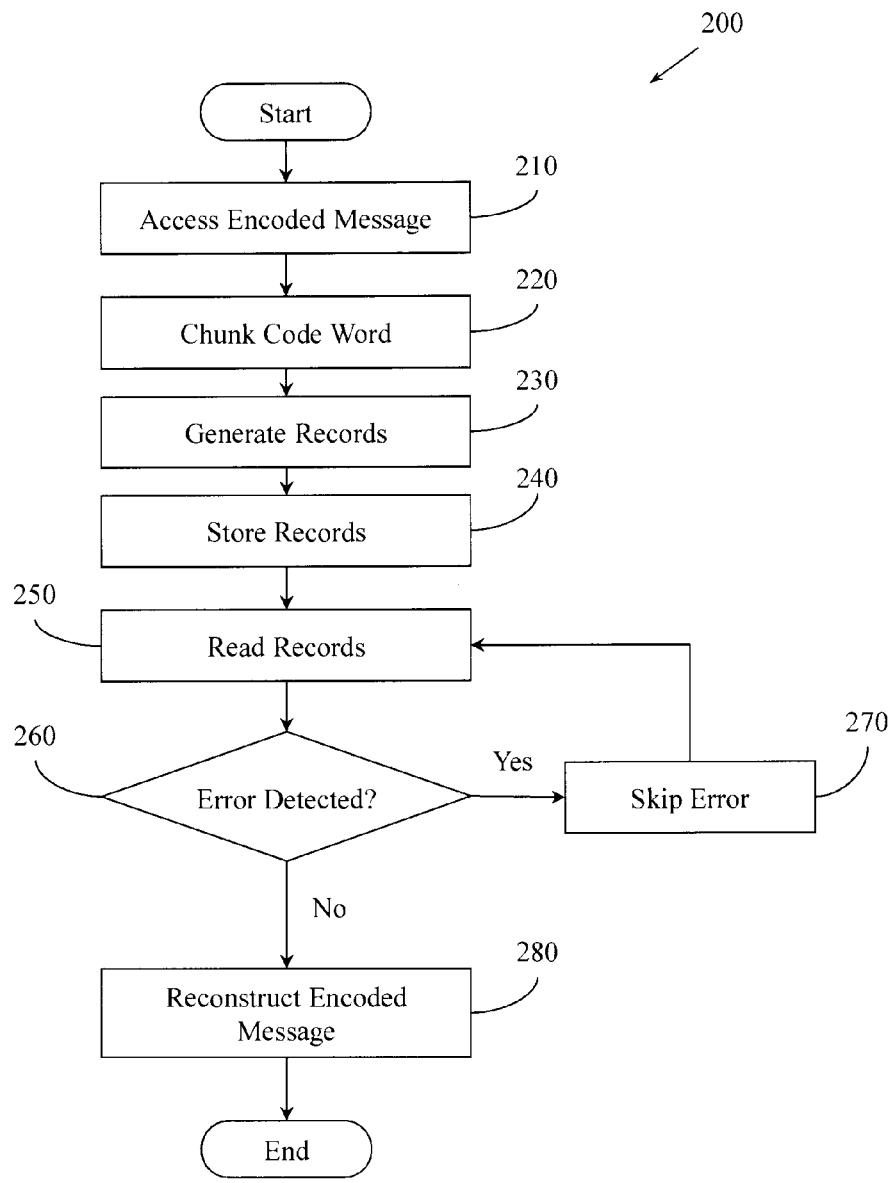
FIG. 2 illustrates an example method for storing and reading data in a data storage system.

FIG. 2 illustrates an example method 200 for storing and reading data in a data storage system. Method 200 is similar to method 100 but includes additional actions. Method 200 includes, at 250, controlling a plurality of tape drives to read a plurality of records from a plurality of tape cartridges. The plurality of tape drives may read the plurality of records substantially in parallel.

Method 200 also includes, at 260, detecting an error in a tape cartridge. If an error is detected, method 200 continues to step 270. If no error was detected, method 200 moves on to step 280.

Method 200 also includes, at 270, controlling the tape drive to skip the error and to continue reading from the tape cartridge. In one embodiment, method 200 determines if the error is within a threshold severity. If the error is within the threshold severity, method 200 controls the tape drive to skip the error. If the error is outside the threshold severity, method 200 may terminate. The threshold severity may be based on the physical size of the damaged region, the number of tracks damaged, the frequency of error, or the type of damage. In another embodiment, the threshold severity may be based on other error parameters. In one embodiment, controlling the tape drive to continue reading from the tape cartridge includes controlling the tape drive to minimize tape repositions. Controlling the tape drive to minimize tape repositions may also include controlling the tape drive to continue reading past a damaged portion of the tape. In one embodiment, method 200 may control the tape drive to skip a dynamically variable distance over the error. For example, method 200 may, upon detecting an error within the threshold severity, control the tape drive to skip 110 mm down the tape and keep reading. The dynamically variable distance skipped may be based on a tape's logical format, the type of error detected, a policy, or other operating conditions of the data storage system.

One example embodiment may include allowing multiple tape drives in a data storage system to continue reading from tapes exhibiting errors without retrying or repositioning or stopping at the error. As long as the data storage system receives at least a threshold number of symbols, the encoded message can still be reconstructed. The threshold number of symbols is a function of the policy. For example, with 16 tapes and a 0.75 rate, there may be 1600 symbols per code-word with 400 parity symbols. As long as the data storage system receives at least 1200 un-damaged symbols for a code-word, the data will not be lost. If less than 1200 symbols are received, the data storage system may enter a retry mode for a particular damaged cartridge or cartridges and try to recover the data.

Method 200 also includes, at 280, reconstructing the encoded message from the plurality of records. The encoded message may be reconstructed from some or all of the plurality of records.

In one embodiment, method 200 may detect that up to a threshold number of tape cartridges are lost or damaged. Upon detecting that up to the threshold number of tape cartridges are lost or fatally damaged, method 200 controls a host system to continue reading from the remaining members of the plurality of tape cartridges. Tape cartridges may not actually be lost, but may be unavailable because a robotic tape library is down, busy, or otherwise unavailable. The threshold number of tape cartridges may be automatically dynamically adaptable based on a policy, the tape format, the operating conditions of the data storage system, the number of tape cartridges currently in use by the data storage system, and other parameters.

In one embodiment of method 200, reconstructing the encoded message from the plurality of records at 280 includes receiving a request to retrieve an encoded message. The request includes request metadata associated with the encoded message. The request metadata may include variables associated with the record metadata, including an end of file marker, an object ID, an access point, an object size, a chunk size, a number of symbols, a symbol size, a block ID, or a number of encoded chunks.

In this embodiment, reconstructing the encoded message from the plurality of records also includes determining, based on the request metadata, the record metadata, and a linear tape file system (LTFS) used by the data storage system, a location for a set of records associated with the encoded message. For example, action 280 may determine, based on the metadata and the LTFS, an end of marker and an access point for a requested encoded message.

Reconstructing the encoded message from the plurality of records also includes reading, substantially in parallel, from the plurality of tape cartridges, the set of records associated with the object ID.

In one embodiment, not all the records need to be read to reconstruct the encoded message. For example, example methods and apparatus may determine that a sufficient number of records containing a sufficient number of code-word chunks to reconstruct the encoded message have been read. Upon determining that a sufficient number of code-word chunks have been read, method 200 may control the plurality of tape drives to stop reading from the plurality of cartridges. Method 200 may also then reconstruct the message from the code-word chunks that have been read. Just as example methods and apparatus may recover data even when some of the tape has been damaged or lost, example methods and apparatus may reconstruct an encoded message without having to read all the associated stored records.

Figure 3:
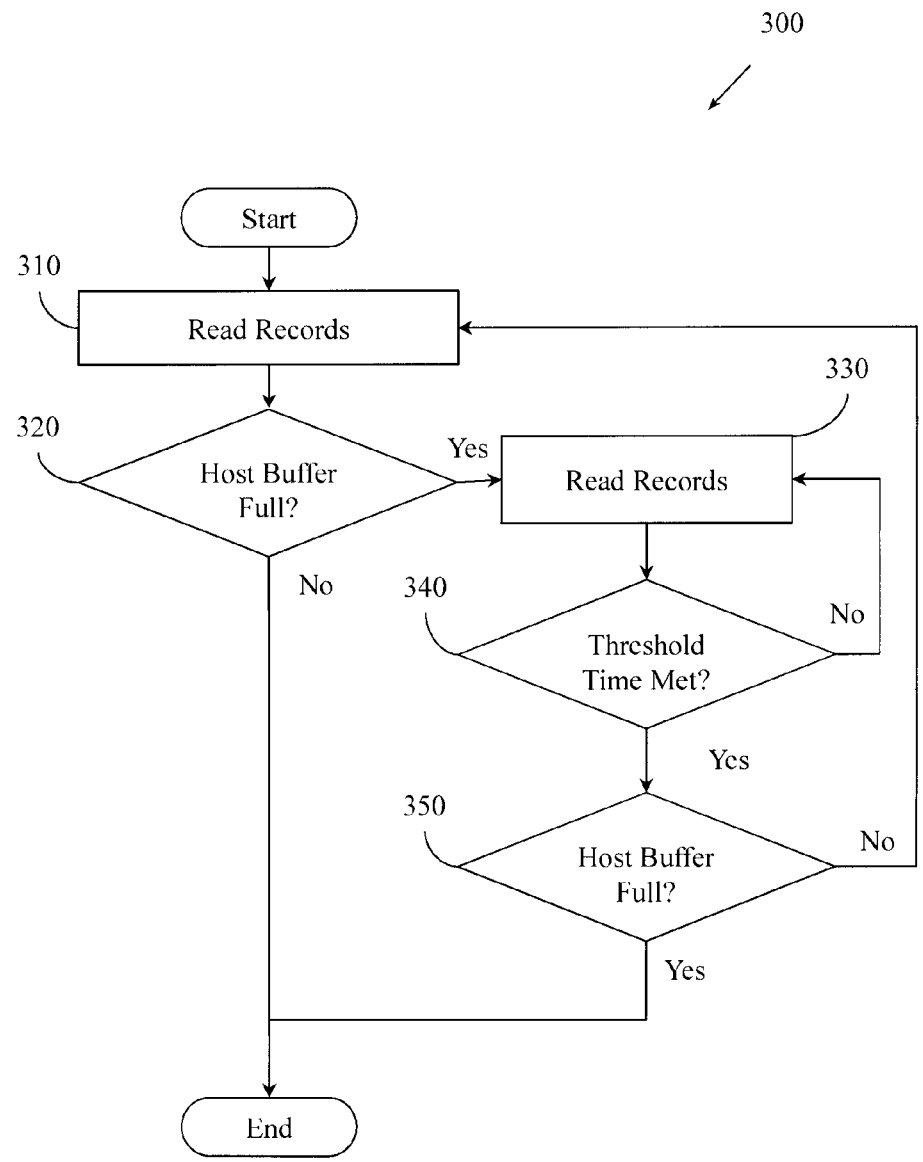
FIG. 3 illustrates an example method for reading data from a data storage system.

FIG. 3 illustrates an example method 300 for reading records. Method 300 may be implemented independently, or may be implemented with methods 100, 200, or in combination with other methods and apparatus disclosed herein. Method 300 includes, at 310, reading records. The records may be read from a plurality of tape cartridges, or may be read from a single tape cartridge, or from a hybrid data storage system. The records may be erasure encoded, interleaved records that are distributed across multiple tape cartridges and down lengths of individual tape. The records may also be erasure encoded, interleaved records that are distributed across multiple data storage devices and within individual data storage devices. Method 300 also includes, at 320, determining whether a host buffer or a host cache in a host system receiving the read data from the plurality of tape cartridges is full. In one embodiment, method 300 determines, at 320, whether the host buffer or cache is within a threshold of being full. In one embodiment, the threshold is 90%. In one embodiment, the host buffer or host cache is a tape drive buffer or a tape drive cache.

Method 300 also includes, at 330, upon determining that the host buffer or host cache is full or within a threshold of being full, continuing to provide data to a host system for a threshold period of time. In one embodiment, the threshold period of time may be 1 second. Method 300 also includes, at 340, determining if the threshold period of time has been met. If the threshold period of time has not been met, method 300 returns to 330 and continues to read records and to provide the records to the host system. If the threshold period of time has been met, method 300 determines, at 350, if the host buffer or host cache is still full. If the host buffer or host cache is still full, or still within a threshold of being full, method 300 may wait, reduce the speed at which data is being read, or terminate. If the host buffer or host cache is not full, method 300 returns to 310 and continues to read records. In one embodiment, the threshold period of time is a function of a policy rate of the erasure code. The threshold period of time may also be a function of the number of tape cartridges in the plurality of tape cartridges on which the encoded message will be stored, the tape length, the read rate of the tape drives, the number of bytes per symbol, or the number of symbols per data set. Because erasure codes are distributed between devices, and because erasure codes are distributed on a device, losing some data by continuing to read while a buffer is full may not be fatal to a read.

If method 300 determines, at 320, that the host buffer or host cache is not full, method 300 may terminate, may hand control to another process, or may continue to read records and continue to provide data to the host system. In one embodiment, continuing to provide data to the host system includes adjusting the read rate of the tape drives from a first read rate to a second, slower read rate without stopping the tape drives. In this embodiment, if the host buffer or host cache is still full, method 300 may, at 350, continue to read records but reduce the speed at which records are read while minimizing tape repositions. Upon detecting that a threshold level of the buffer or a threshold level of the cache is clear, method 300 may control the tape drives to return to the first read rate.

In one embodiment, a code-word includes a number of symbols K. K is an integer greater than 0. K may be defined as $K=C \cdot m \cdot d$, where C is a function of the number of tape cartridges in the plurality of tape cartridges on which the encoded message will be stored. In this embodiment, d is the number of data sets to be used in a length of tape L. L is the length of tape in a tape cartridge over which encoded data is spread, and m is the number of symbols from the code-word that are in an individual data set.

In this embodiment, the number of data sets d to be used in L meters of tape is defined as $d=L/l$. Here, l is the length in meters of a data set defined by a tape cartridge logical format.

The number of records in the plurality of records is defined as $N=x/l$. In this example, x is the length of tape in meters used for interleaving. In one embodiment, the tape cartridge is an LTO-6 cartridge, and l=0.1 m. In other embodiments, other types or formats of tape may be used, other lengths l may be used, and other lengths of tape x may be used for interleaving. Additionally, the number of bytes T per symbol is a function of the erasure code. In another embodiment, the number of bytes T per symbol is adaptable.

In one embodiment, the number of code-words into which a message is encoded is a function of the number of tape cartridges in the plurality of tape cartridges on which the encoded message will be stored. The number of code-words into which the message is encoded may also be a function of the tape length, the symbol size, the policy rate, or the protection policy. In other embodiments, the number of code-words into which a message is encoded may be a function of other variables, including the number of data storage devices used to store the records, and may be dynamically adaptable.

In one example, a method may be implemented as computer executable instructions. Thus, in one example, a non-transitory computer-readable storage medium may store computer executable instructions that if executed by a machine (e.g., computer) cause the machine to perform methods described or claimed herein including method 100, method 200, method 300, and method 400. While executable instructions associated with the listed methods are described as being stored on a computer-readable storage medium, it is to be appreciated that executable instructions associated with other example methods described or claimed herein may also be stored on a computer-readable storage medium. In different embodiments, the example methods described herein may be triggered in different ways. In one embodiment, a method may be triggered manually by a user. In another example, a method may be triggered automatically.

Figure 4:
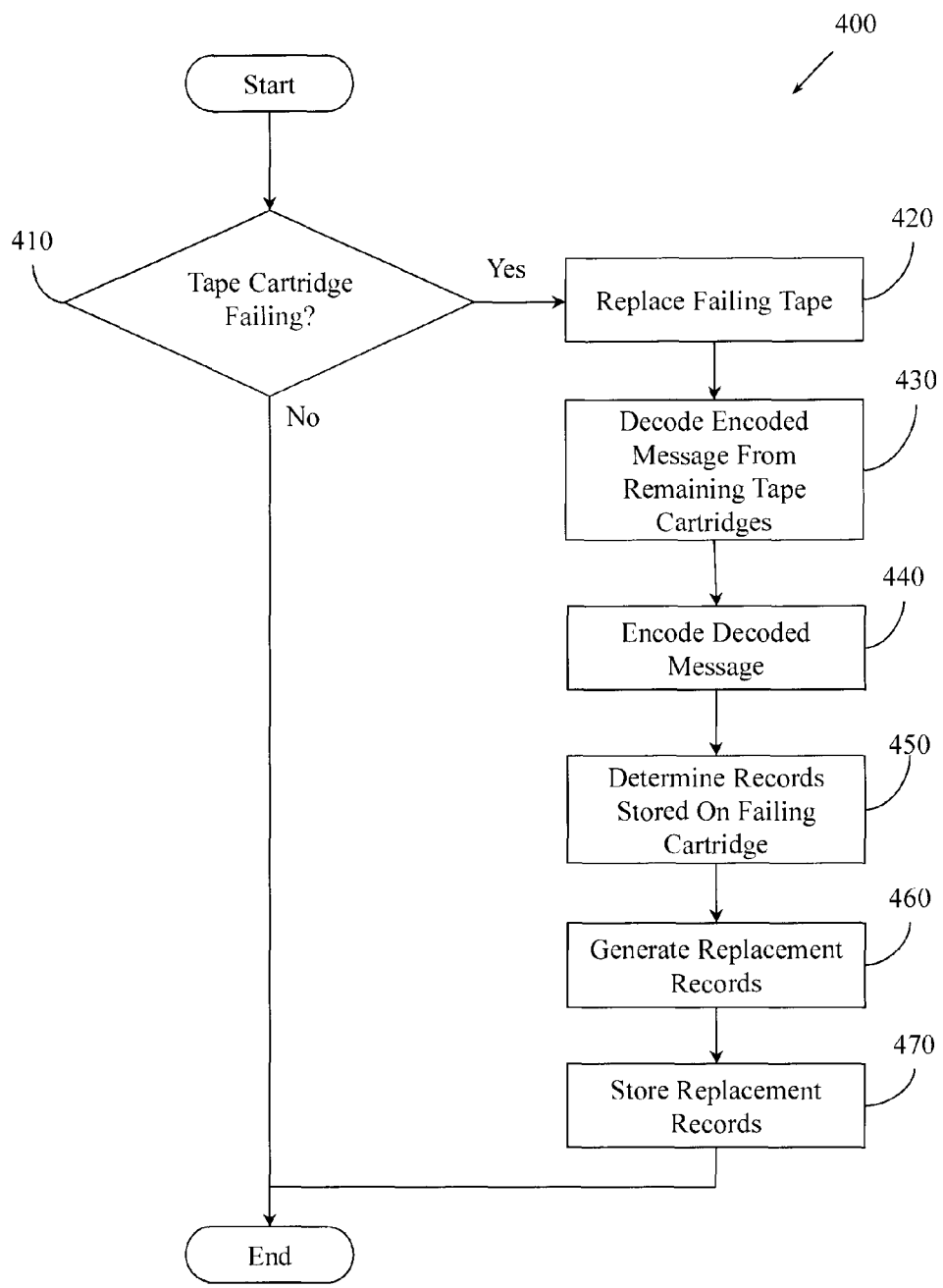
FIG. 4 illustrates an example method for repairing a failing tape cartridge in a data storage system.

FIG. 4 illustrates an example method 400 for repairing or replacing damaged or failing tape cartridges. Method 400 includes, at 410, detecting that a tape cartridge is within a threshold probability of failing. In one embodiment, the threshold is 50%. Upon detecting that that the tape cartridge is within a threshold probability of failing, method 400 includes, at 420, replacing the failing tape cartridge with a new tape cartridge. In another embodiment, method 400 may repair or replace data storage devices other than tape cartridges, including a hard disk drive (HDD), a solid state drive (SSD), or a shingled magnetic recording (SMR) device.

Method 400 also includes, at 430, decoding the encoded message using the records stored on the remaining tape cartridges. Method 400 also includes, at 440, encoding the decoded message. The decoded message may be encoded using the same EC used to encode the message. Method 400 also includes, at 450, determining which records are stored on the failing tape cartridge and, at 460, generating replacement records corresponding to the records stored on the failing tape cartridge. Method 400 also includes, at 470, storing the replacement records on the new tape cartridge.

FIGS. 12 and 13 illustrate an example implementation of method 400. In the example illustrated in FIGS. 12 and 13, a plurality of tape cartridges includes 3 functional tape cartridges 1210, and a failing tape cartridge 1220. Records 1230 are decoded from the tape cartridges 1210. The encoded data 1250 is constructed from the records 1230 retrieved from the set of tape cartridges 1210. Missing records 1240 were stored on the failing tape cartridge 1220.

In FIG. 13, the encoded data 1360 required to reconstruct the missing records 1240 is used to generate replacement records 1340. Encoded data not needed to generate the replacement records 1340 is indicated at 1350. Replacement records 1340 are stored on a replacement tape cartridge 1320. While in this example, three functional tape cartridges, one failing tape cartridge, and one replacement tape cartridge are described, other embodiments may use different numbers of tape cartridges to decode the encoded message into different numbers of records.

Figure 5:
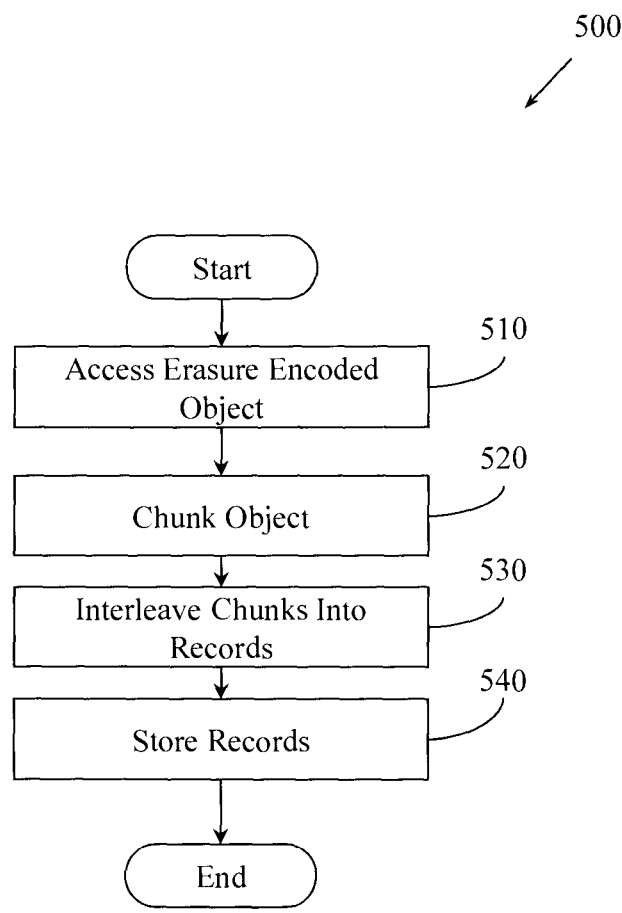
FIG. 5 illustrates an example method for storing data in a hybrid data storage system.

FIG. 5 illustrates an example method 500 for storing data in a hybrid data storage system. In one embodiment, the hybrid data storage system includes a plurality of storage devices having different initial read speeds. The hybrid data storage system may include a tape drive, an HDD, an SSD, or an SMR device. In other embodiments, other types or formats of data storage devices may be included in the hybrid data storage system.

Method 500 includes, at 510, accessing an erasure encoded object. The erasure encoded object includes a plurality of code-words. The erasure encoded object may have been encoded by a Raptor code, a Reed Solomon code, a rateless code, or by a different erasure code. In one embodiment, the hybrid data storage system generates the erasure encoded object.

Method 500 also includes, at 520, chunking a code-word from the plurality of code-words into a set of code-word chunks. In one embodiment, the size of the set of code-word chunks is a function of the number storage devices in the hybrid data storage system on which the encoded object will be stored. For example, if there are 16 data storage devices in the hybrid data storage system, the set of code-word chunks may include 16 code-word chunks. In another embodiment, other numbers of code-word chunks may be used.

Method 500 also includes, at 530, generating a plurality of records by interleaving into a record a first code-word chunk from a first member of the plurality of code-words with a second, different code-word chunk from a second, different member of the plurality of code-words. A record includes metadata about the code-word chunks interleaved into the record.

Figure 11:
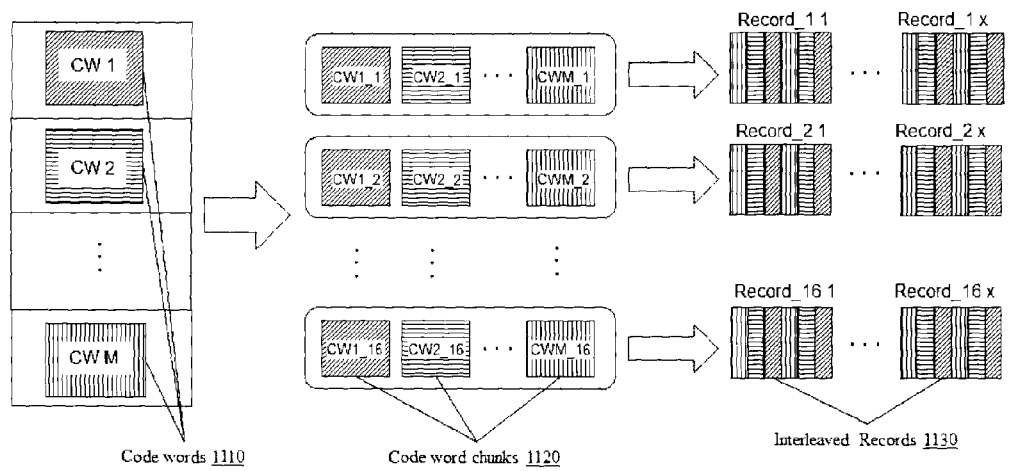
FIG. 11 is a flow diagram of interleaving code-word chunks into records.

FIG. 11 illustrates an example data flow path for interleaving code-word chunks into records that may be employed by example methods and apparatus. The data flow path illustrated in FIG. 11 may be applied to data storage systems that use tape storage, HDD, SSD, solid-state hybrid drives (SSHD), or SMR. In FIG. 11, user files have already been chunked into a plurality of code-words 1110. The user files may have been encoded with an erasure code, including a Raptor code, a Reed Solomon code, or other rateless code. Code-words 1110 are then chunked into code-word chunks 1120. Code-words include symbols. Thus, code-word chunks also include symbols.

In one example, using a 16 tape cartridge data storage system, a code-word CW1 may be chunked into a set of 16 code-word chunks {CW1_1, CW1_2, . . . CW1_16}. Another code-word, CW2, may be chunked into a set of 16 code-word chunks {CW2_1, CW2_2, . . . CW2_16}. Similarly, if there are M code-words, a code-word CWM may be chunked into a set of code-word chunks {CWM_1, CWM_2, . . . CWM_16}.

In the example illustrated by FIG. 11, note that code-word chunks {CW1_1, CW2_1, . . . CWM_1} are grouped together. Similarly, code-word chunks {CW1_16, CW2_16, . . . CWM_16} are also grouped together into a different group. Thus, in this example, the "_1" code-word chunks are grouped together in a first group. Similarly, the "_2" code-word chunks are grouped into a second group, and the "_16" code-word chunks are grouped together into a sixteenth group. Since the code-word chunks include a plurality of symbols, the symbols may be interleaved to form interleaved records 1130. In this example, the group of code-word chunks {CW1_16, CW2_16, . . . CWM_16} is interleaved into a set of interleaved records 1130. FIG. 11 shows that the set of interleaved records 1130 includes a plurality of records, ranging from Record_16 1 to Record_16 x. The number of records in a plurality of records may vary based on symbol size, code-word size, the length of tape being used, a tape logical format, performance considerations, and other variables. The data flow path illustrated by FIG. 11 may be employed by the methods and apparatus described herein.

Method 500 also includes, at 540, storing the plurality of records on the plurality of storage devices. Storing the plurality of records includes storing a first record on a first storage device and storing a second, different record on a second, different storage device. Storing a record on a storage device includes storing code-word chunks from the same code-word at least a threshold physical distance apart on the storage device. In one embodiment, the threshold physical distance is sufficient to insure that code-word chunks from the same code-word are not physically adjacent. This produces the double distribution of erasure codes where erasure codes are spread out on any single device and are distributed onto multiple different devices.

Figure 6:
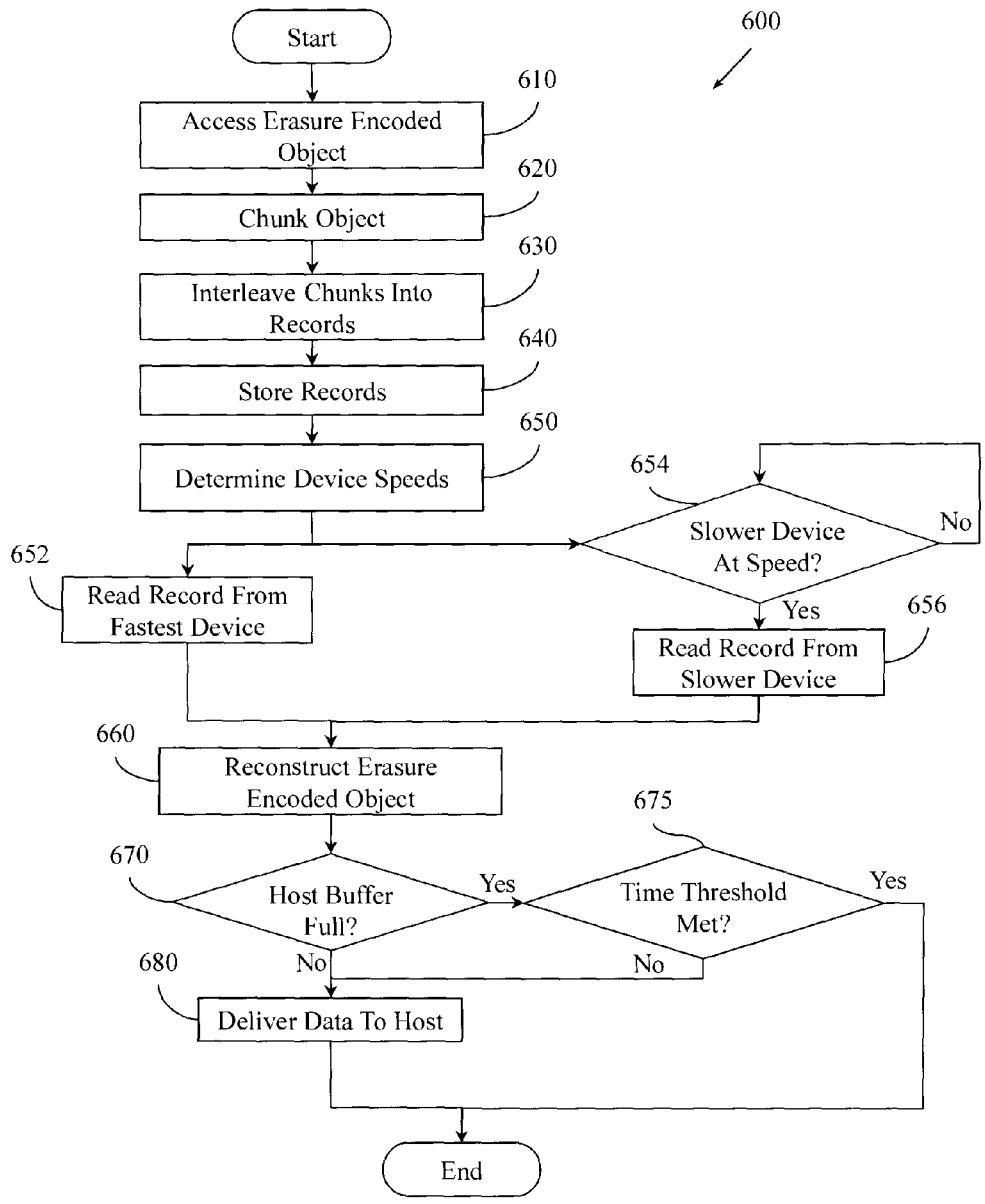
FIG. 6 illustrates an example method for storing and reading data in a hybrid data storage system.

FIG. 6 illustrates an example method 600 for storing and reading data in a hybrid data storage system that is similar to method 500 but includes additional actions. Method 600 includes, at 650, determining the initial read speeds of the devices in the hybrid data storage system. Determining the initial read speeds may include determining the time it takes a data storage device to reach a threshold read speed, an optimum read speed, or other operating parameter. Determining the initial read speeds may also include determining the time it takes storage devices to reach a threshold read speed or operating parameter. For example, method 600 may determine that an SSD has the fastest initial read speed, while an HDD has a slower initial read speed, and a tape drive has a slowest initial read speed. Method 600 may also determine that it takes an HDD x seconds to reach an optimum read speed, while it takes a tape drive 5x seconds to reach an optimum read speed. Upon determining which storage device in the plurality of storage devices has the fastest initial read speed, method 600 includes, at 652, reading a record from the storage device with the fastest initial read speed. Method 600 also includes, at 654, determining if a remaining storage device has attained a threshold read speed. Upon determining that the remaining storage device has attained a threshold read speed, method 600 includes, at 656, reading a record from the slower device. Thus, method 600 may control a data storage system to begin reading data from an SSD while waiting for an HDD to spin up to speed. While receiving data from the SSD and while the HDD spins up, tape drives in the data storage system may begin loading tape cartridges. In this example, 5x seconds after loading a tape cartridge, data may be read from the SDD, the spun-up HDD, and the tape drives that are now up to speed.

Method 600 also includes, at 660, reconstructing the encoded object from the plurality of records. The encoded object may be reconstructed from records read from the faster storage device, the slower storage device, or a combination of records from storage devices with different speeds. The erasure encoded object may be reconstructed from a subset of all the records stored associated with the object, or from all the records stored associated with the object.

Method 600 also includes, at 670, determining if a host buffer or host cache is full. If the host buffer or host cache is not full, method 600 delivers the data to the host at 680. Upon detecting a full buffer or a full cache in a host system retrieving data from the plurality of storage devices, method 600 includes, at 675, determining if a threshold period of time has been met. If the threshold time has not been met, method 600 controls the plurality of storage devices at 680 to continue delivering data to the host system. If method 600 determines at 675 that the threshold period of time has been met, method 600 may terminate, may continue providing data at a first rate, or may continue providing data a slower rate.

Figure 7:
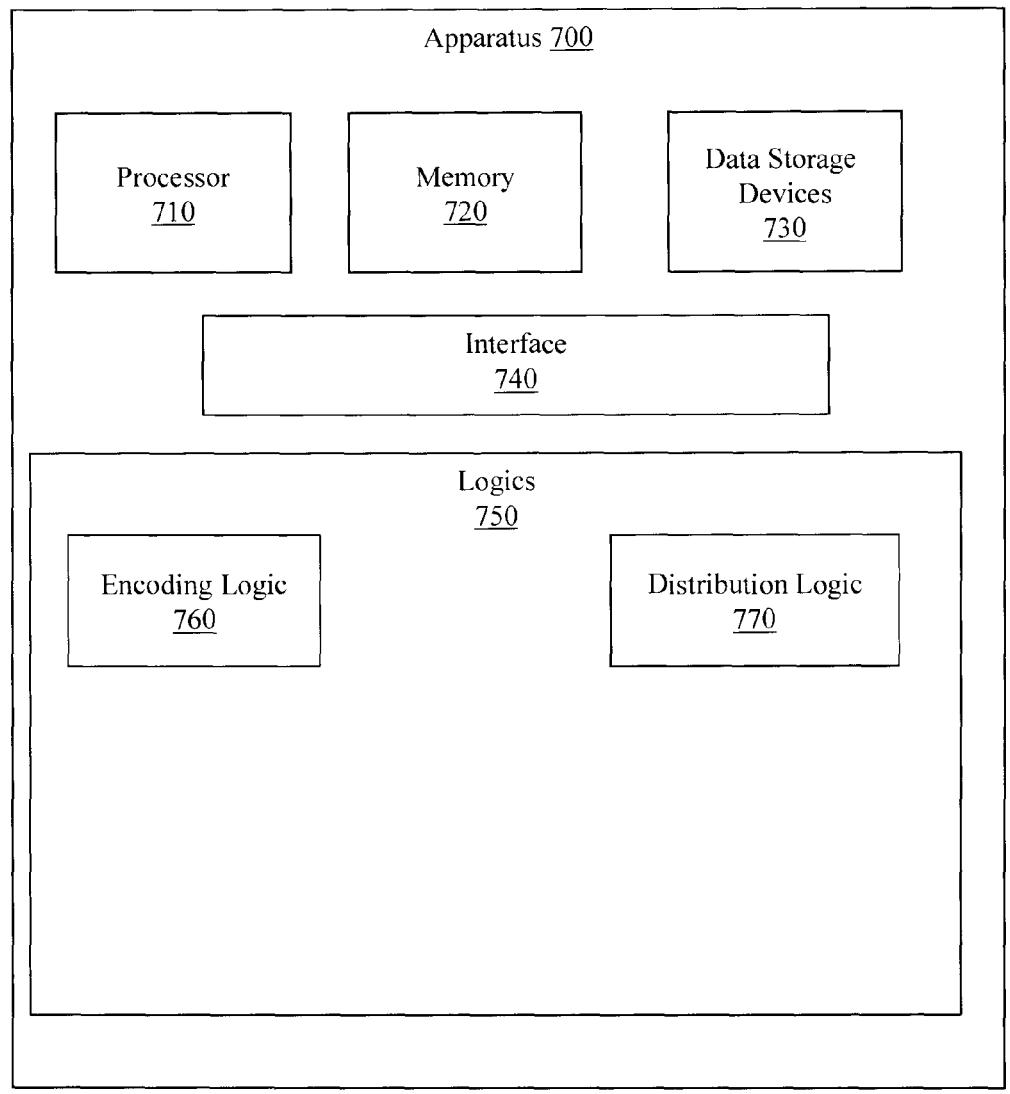
FIG. 7 illustrates an example apparatus for storing erasure encoded data.

FIG. 7 illustrates an example apparatus 700 for storing erasure encoded data. Apparatus 700 includes a processor 710, a memory 720, data storage devices 730, a set of logics 750, and an interface 740 that connects the processor 710, the memory 720, the data storage devices 730, and the set of logics 750. The set of logics 750 includes an encoding logic 760 and a distribution logic 770. In one embodiment, the functionality associated with the set of logics 750 may be performed, at least in part, by hardware logic components. The hardware logic components may include but are not limited to, field-programmable gate arrays (FPGAs), application specific integrated circuits (ASICs), application specific standard products (ASSPs), system on a chip systems (SOCs), graphic processing units (GPUs), or complex programmable logic devices (CPLDs). In one embodiment, individual members of the set of logics 750 are implemented as ASICs or SOCs.

In one embodiment of apparatus 700, encoding logic 760 and distribution logic 770 are FPGAs, ASICs, ASSPs, SOCs, or CPLDs. In another embodiment, encoding logic 760 and distribution logic 770 may be other types of systems or circuits.

In one embodiment, encoding logic 760 generates an erasure encoded object. The erasure encoded object includes a code-word (CW). Encoding logic 760 chunks the CW into a set of CW chunks. Encoding logic 760 is controlled, at least in part, by a redundancy policy. Encoding logic 760 may use a Raptor code, a Reed Solomon code, a linear Fountain code, or another rateless code to generate the erasure encoded object.

In one embodiment, distribution logic 770 interleaves members of the set of CW chunks into a plurality of records. FIG. 11 illustrates an example implementation of interleaving CW chunks into a plurality of records that apparatus 700 may use. Distribution logic 770 also distributes the plurality of records across the set of data storage devices. Thus, code word chunks may be distributed across a number of devices to mitigate issues with the failure of an entire device and may be distributed in a particular device to mitigate small scale errors on that particular device.

Figure 8:
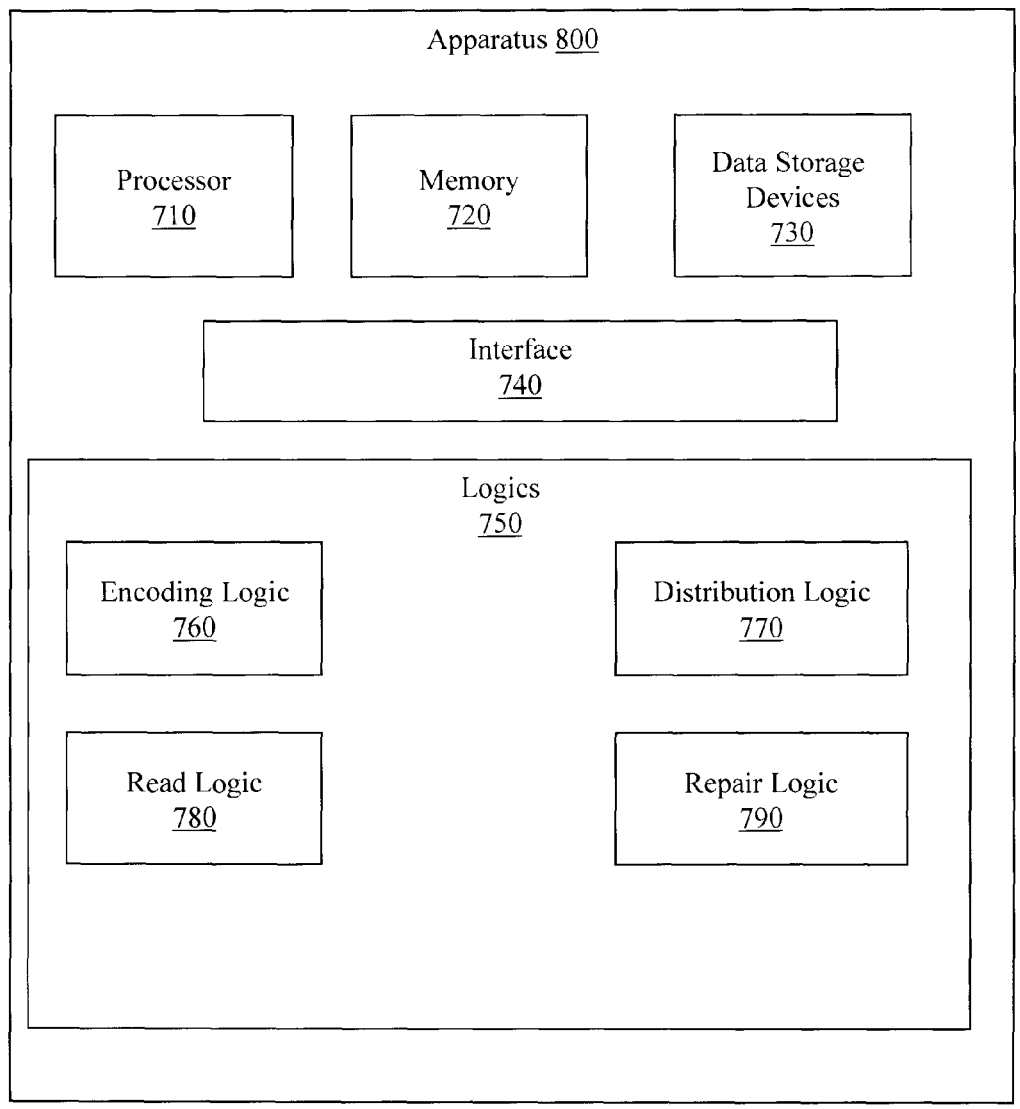
FIG. 8 illustrates an example apparatus for storing and reading erasure encoded data.

FIG. 8 illustrates an example apparatus 800 that is similar to apparatus 700 but includes additional logics. Apparatus 800 includes read logic 780 and repair logic 790. Read logic 780 reads the plurality of records from the set of data storage devices substantially in parallel. Read logic 780 also ignores read errors that are within a threshold severity, and re-assembles the erasure encoded object from the plurality of records.

Repair logic 790 repairs or replaces members of the set of data storage devices. Repair logic 790 designates as a failing storage device a member of the set of data storage devices that has a threshold probability of failure, or that exhibits read errors outside the threshold severity. Repair logic 790 also generates a replacement subset of the plurality of records that are stored on the failing storage device. Repair logic 790 also replaces the failing storage device with a replacement data storage device. Replacement logic 790 also stores the replacement subset on the replacement data storage device. FIGS. 12 and 13 illustrate an example approach suitable for use by repair logic 790 to repair erasure encoded data stored as interleaved records in a data storage system.

Figure 9:
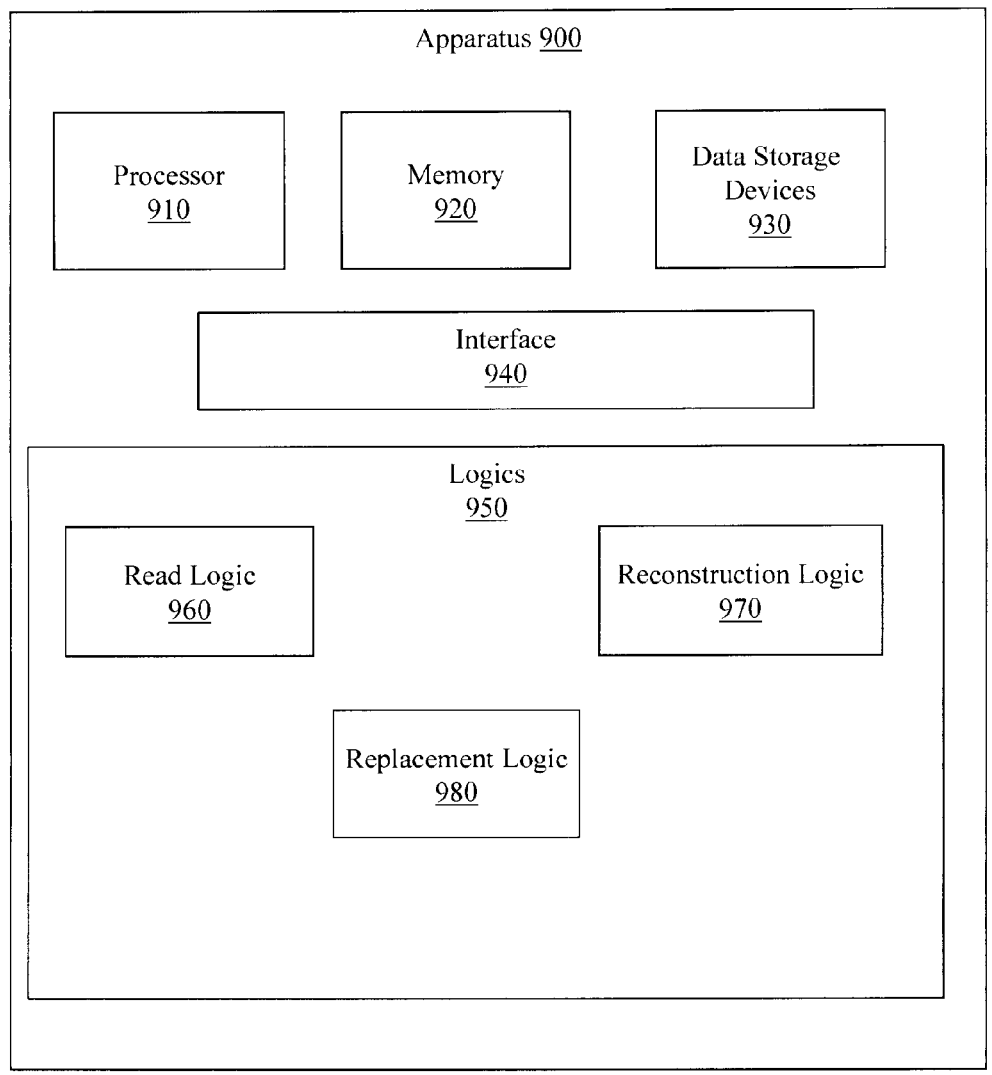
FIG. 9 illustrates an example apparatus for reading and repairing stored erasure encoded data.

FIG. 9 illustrates an example apparatus 900 for reading erasure encoded objects stored on a cloud data storage system or other doubly distributed system. Apparatus 900 includes a processor 910, a memory 920, data storage devices 930, a set of logics 950, and an interface 940 that connects the processor 910, the memory 920, the data storage devices 930, and the set of logics 950. The set of logics 950 includes a read logic 960, a reconstruction logic 970, and a replacement logic 980. In one embodiment, the functionality associated with the set of logics 950 may be performed, at least in part, by hardware logic components. The hardware logic components may include but are not limited to, FPGAs, ASICs, ASSPs, SOCs, or CPLDs. In one embodiment, individual members of the set of logics 950 are implemented as ASICs or SOCs.

In one embodiment of apparatus 900, the set of data storage devices 930 stores an erasure encoded object in a plurality of records. In one embodiment, the set of data storage devices 930 is located outside the apparatus 900. The plurality of records are distributed across a plurality of data storage devices in the set of data storage devices 930. In this example, a record stored on a data storage device includes metadata associated with the erasure encoded object. The record also includes code-word chunks associated with a first code-word interleaved with code-word chunks associated with a second, different code-word. A first code-word chunk associated with the first code-word is stored at least a threshold physical distance apart from a second, different code-word chunk associated with the first code-word. For example, if 10 meters of tape is being used, and if a data set uses 10 cm of tape, the threshold physical distance apart may be 11 cm. The threshold physical distance may be automatically dynamically adapted based on user preferences, environmental conditions, and other factors.

The set of logics 950 includes a read logic 960 that reads the plurality of records from the set of data storage devices 930. In one embodiment, read logic 960 reads from the set of data storage devices 930 substantially in parallel. Read logic 960 also ignores read errors that are within a threshold severity. For example, if a read error indicates that 5 mm of tape are damaged, read logic 960 may control a tape drive to skip the damaged 5 mm section of tape and continue reading from the tape. In another embodiment, read logic may control the tape drive to skip a dynamically variable distance of tape, or to skip a fixed distance of tape, and to continue reading after skipping the selected distance of tape.

The set of logics 950 also includes a reconstruction logic 970 that re-assembles the erasure encoded object from the plurality of records. Reconstruction logic 970 may reassemble the erasure encoded object from less than all of the plurality of records, or from all of the plurality of records.

The set of logics 950 also includes a replacement logic 980. Replacement logic 980 repairs data stored on a failing data storage device within the plurality of data storage devices. In one embodiment, a failing data storage device is a data storage device that exhibits a threshold frequency of read errors. A failing data storage device may also be a data storage device that exhibits a read error outside the threshold severity, or that exhibits a threshold level of physical damage. For example, a failing data storage device may exhibit 1 error per every 1,000,000 read operations, or 9 cm of damaged tape per 10 meters of tape. A failing data storage device may also be a lost data storage device.

While FIGS. 7-9 illustrate example apparatuses 700, 800, and 900 that include various components connected in various ways, it is to be appreciated that other apparatus may include other components connected in other ways.

Figure 10:
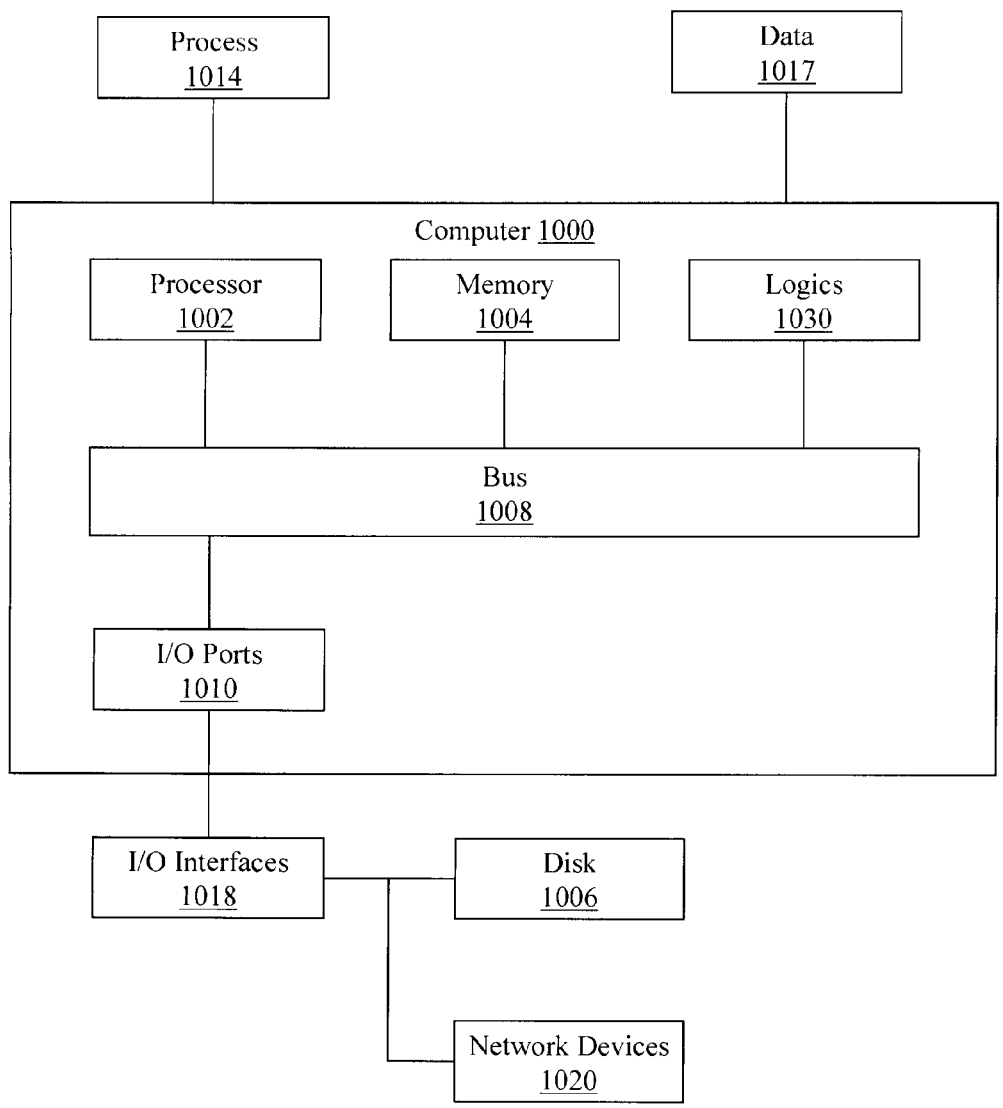
FIG. 10 illustrates an example computer in which example methods and apparatus may operate.

FIG. 10 illustrates an example computer 1000 in which example methods illustrated herein can operate and in which example logics may be implemented. In different examples, computer 1000 may be part of a tape data storage system, a hybrid data storage system, or may be operably connectable to a data storage system.

Computer 1000 includes a processor 1002, a memory 1004, and input/output ports 1010 operably connected by a bus 1008. In one example, computer 1000 may include a set of logics 1030 that perform a method of storing erasure encoded data as interleaved records across a plurality of tape drives. Thus, the set of logics 1030, whether implemented in computer 1000 as hardware, firmware, software, and/or a combination thereof may provide means (e.g., hardware, software) for storing erasure encoded data as interleaved records across a plurality of tape drives. In different examples, the set of logics 1030 may be permanently and/or removably attached to computer 1000. In one embodiment, the functionality associated with the set of logics 1030 may be performed, at least in part, by hardware logic components including, but not limited to, FPGAs, ASICs, ASSPs, SOCs, or CPLDs. In one embodiment, individual members of the set of logics 1030 are implemented as ASICs or SOCs.

Processor 1002 can be a variety of various processors including dual microprocessor and other multi-processor architectures. Memory 1004 can include volatile memory and/or non-volatile memory. A disk 1006 may be operably connected to computer 1000 via, for example, an input/output interface (e.g., card, device) 1018 and an input/output port 1010. Disk 1006 may include, but is not limited to, devices like a magnetic disk drive, a tape drive, a Zip drive, a flash memory card, or a memory stick. Furthermore, disk 1006 may include optical drives like a CD-ROM or a digital video ROM drive (DVD ROM). Memory 1004 can store processes 1014 or data 1017, for example. Disk 1006 or memory 1004 can store an operating system that controls and allocates resources of computer 1000.

Bus 1008 can be a single internal bus interconnect architecture or other bus or mesh architectures. While a single bus is illustrated, it is to be appreciated that computer 1000 may communicate with various devices, logics, and peripherals using other busses that are not illustrated (e.g., PCIE, SATA, Infiniband, 1394, USB, Ethernet).

Computer 1000 may interact with input/output devices via I/O interfaces 1018 and input/output ports 1010. Input/output devices can include, but are not limited to, a keyboard, a microphone, a pointing and selection device, cameras, video cards, displays, disk 1006, network devices 1020, or other devices. Input/output ports 1010 can include but are not limited to, serial ports, parallel ports, or USB ports.

Computer 1000 may operate in a network environment and thus may be connected to network devices 1020 via I/O interfaces 1018 or I/O ports 1010. Through the network devices 1020, computer 1000 may interact with a network. Through the network, computer 1000 may be logically connected to remote computers. The networks with which computer 1000 may interact include, but are not limited to, a local area network (LAN), a wide area network (WAN), or other networks.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable storage medium", as used herein, refers to a non-transitory medium that stores instructions or data. "Computer-readable storage medium" does not refer to propagated signals. A computer-readable storage medium may take forms, including, but not limited to, non-volatile media, and volatile media. Non-volatile media may include, for example, optical disks, magnetic disks, tapes, and other media. Volatile media may include, for example, semiconductor memories, dynamic memory, and other media. Common forms of a computer-readable storage medium may include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

"Logic", as used herein, includes but is not limited to hardware, firmware, software in execution on a machine, or combinations of each to perform a function(s) or an action(s), or to cause a function or action from another logic, method, or system. Logic may include a software controlled microprocessor, a discrete logic (e.g., ASIC), an analog circuit, a digital circuit, a programmed logic device, a memory device containing instructions, and other physical devices. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

To the extent that the term "includes" or "including" is employed in the detailed description or the claims, it is intended to be inclusive in a manner similar to the term "comprising" as that term is interpreted when employed as a transitional word in a claim.

Throughout this specification and the claims that follow, unless the context requires otherwise, the words 'comprise' and 'include' and variations such as 'comprising' and 'including' will be understood to be terms of inclusion and not exclusion. For example, when such terms are used to refer to a stated integer or group of integers, such terms do not imply the exclusion of any other integer or group of integers.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

What is claimed is:

1. A non-transitory computer-readable storage device storing computer executable instructions that when executed by a computer control the computer to perform a method for storing data in a data storage system, the method comprising:
   accessing an encoded message, where the encoded message includes a plurality of code-words;
   chunking a code-word from the plurality of code-words into C code-word chunks, where C is an integer greater than zero, and where C is a function of the number of tape cartridges in a plurality of tape cartridges on which the encoded message will be stored;
   generating a plurality of records by interleaving into a record a first code-word chunk from a first member of the plurality code-words with a second, different code-word chunk from a second, different member of the plurality of code-words, where a record includes record metadata about the code-word chunks interleaved into the record; and
   storing the plurality of records on the plurality of tape cartridges, where storing the plurality of records includes storing a first record on a first tape cartridge and storing a second, different record on a second, different tape cartridge, where storing a record on a selected tape cartridge includes storing code-word chunks from the same code-word at least a threshold physical distance apart on the selected tape cartridge, where the threshold physical distance is based on a logical format of the tape cartridge, an amount of data to be stored, a protection policy, a level of interleaving, a number of code-words, a symbol size, a data set size, a desired number of nines of durability, an environmental condition, a tape length, or a number of tape cartridges in the plurality of tape cartridges.

2. The non-transitory computer-readable storage device of claim 1, the method comprising:
   controlling a plurality of tape drives to read the plurality of records from the plurality of tape cartridges;
   upon detecting an error in a tape cartridge, where the error is less than a threshold severity, controlling a tape drive to skip the error and to continue reading from the tape cartridge; and
   reconstructing the encoded message from the plurality of records.

3. The non-transitory computer-readable storage device of claim 2, the method comprising:
   upon detecting that up to a threshold number of tape cartridges are unavailable, lost or fatally damaged, controlling a host system to continue reading from the remaining members of the plurality of tape cartridges.

4. The non-transitory computer-readable storage device of claim 3, the method comprising:
   upon detecting a full buffer or a full cache in the data storage system receiving data from the plurality of tape cartridges, controlling the tape drives to continue providing data to a host system for a threshold period of time.

5. The non-transitory computer-readable storage device of claim 2, where the encoded message is encoded using an erasure code, where the erasure code is Raptor code, a Fountain code, or a Reed Solomon code.

6. The non-transitory computer-readable storage device of claim 5, where a code-word includes a number of symbols K, where K is an integer greater than zero, where K is defined as K=C·m·d, where
  C is a function of the number of tape cartridges in the plurality of tape cartridges on which the encoded message will be stored,
  d is the number of data sets to be used in a length of tape L, where L is the length of tape in a tape cartridge over which encoded data is spread, and
  m is the number of symbols from the code-word that are in a single data set.

7. The non-transitory computer-readable storage device of claim 6, where the number of data sets d to be used in L meters of tape is defined as d=L/l, where l is the length in meters of a data set defined by a tape cartridge logical format.

8. The non-transitory computer-readable storage device of claim 7, where the number of records in the plurality of records is defined as N=x/l, where x is the length of tape in meters used for interleaving.

9. The non-transitory computer-readable storage device of claim 8, where the tape cartridge is an LTO-6 cartridge, and l=0.1 m.

10. The non-transitory computer-readable storage device of claim 9, where the number of bytes T per symbol is a function of the erasure code, or is adaptable.

11. The non-transitory computer-readable storage device of claim 10, where controlling the tape drive to continue reading from the tape cartridge includes controlling the tape drive to minimize tape repositions or to continue reading past a damaged portion of the tape.

12. The non-transitory computer-readable storage device of claim 11, where controlling the tape drives to continue providing data to the host system includes:
  adjusting the read rate of the tape drives from a first read rate to a second, slower read rate without stopping the tape drives; and
  upon detecting that a threshold level of the buffer or a threshold level of the cache is clear, controlling the tape drives to return to the first read rate.

13. The non-transitory computer-readable storage device of claim 12, where the threshold period of time is a function of a policy rate of the erasure code, the number of tape cartridges in the plurality of tape cartridges on which the encoded message will be stored, the tape length, the read rate of the tape drives, the number of bytes per symbol, or the number of symbols per data set.

14. The non-transitory computer-readable storage device of claim 13, where the number of code-words into which a message is encoded is a function of the number of tape cartridges in the plurality of tape cartridges on which the encoded message will be stored, a tape length, a symbol size, the policy rate, or a protection policy.

15. The non-transitory computer-readable storage device of claim 1, where, upon detecting that a tape cartridge is within a threshold probability of failing, replacing the failing tape cartridge with a new tape cartridge, and
  decoding the encoded message using the records stored on the remaining tape cartridges;
  encoding the decoded message;
  determining which records are stored on the failing tape cartridge;
  generating replacement records corresponding to the records stored on the failing tape cartridge; and
  storing the replacement records on the new tape cartridge.

16. The non-transitory computer-readable storage device of claim 1, where the record metadata includes an end of file marker, an object ID, an access point, an object size, a chunk size, a number of symbols, a symbol size, a block ID, or a number of encoded chunks.

17. The non-transitory computer-readable storage device of claim 16, where reconstructing the encoded message from the plurality of records includes:
  receiving a request to retrieve an encoded message, where the request includes request metadata associated with the encoded message;
  determining, based on the request metadata, the record metadata, and a linear tape file system (LTFS) used by the data storage system, a location for a set of records associated with the encoded message; and
  reading, substantially in parallel, from the plurality of tape cartridges, the set of records associated with the object ID.

18. The non-transitory computer-readable storage device of claim 17, the method comprising:
  upon determining that a sufficient number of records containing a sufficient number of code-word chunks to reconstruct the encoded message have been read:
    controlling the plurality of tape drives to stop reading from the plurality of tape cartridges; and
    reconstructing the message from the code-word chunks that have been read.

19. A non-transitory computer-readable storage device storing computer executable instructions that when executed by a computer control the computer to perform a method for storing data in a hybrid data storage system, where the hybrid data storage system includes a plurality of storage devices having different initial read speeds, including a tape drive, a hard disk drive (HDD), a solid state device (SSD), or a shingled magnetic recording (SMR) device, the method comprising:
  accessing an erasure encoded object, where the erasure encoded object includes a plurality of code-words;
  chunking a code-word from the plurality of code-words into a set of code-word chunks, where the size of the set of code-word chunks is a function of the number storage devices in the hybrid data storage system on which the encoded object will be stored;
  generating a plurality of records by interleaving into a record a first code-word chunk from a first member of the plurality code-words with a second, different code-word chunk from a second, different member of the plurality of code-words, where a record includes metadata about the code-word chunks interleaved into the record; and
  storing the plurality of records on the plurality of storage devices, where storing the plurality of records includes storing a first record on a first storage device and storing a second, different record on a second, different storage device, where storing a record on a storage device includes storing code-word chunks from the same code-word at least a threshold physical distance apart on the storage device, where the threshold physical distance is based on a logical format of the storage device, an amount of data to be stored, a protection policy, a level of interleaving, a number of code-words, a symbol size, a data set size, a desired number of nines of durability, an environmental condition, or a number of storage devices in the plurality of storage devices.

20. The non-transitory computer-readable storage device of 19, the method comprising:
upon determining which storage device in the plurality of storage devices has the fastest initial read speed;
reading a record from the storage device with the fastest initial read speed;
upon determining that a remaining storage device has attained a threshold read speed;
reading a record from the remaining storage device;
reconstructing the encoded object from the plurality of records; and
upon detecting a full buffer or a full cache in a host system retrieving data from the plurality of storage devices, controlling the plurality of storage devices to continue delivering data to the host system for a threshold period of time.

* * * * *